(12) United States Patent
Brunnbauer et al.

(10) Patent No.: US 7,429,782 B2
(45) Date of Patent: Sep. 30, 2008

(54) SEMICONDUCTOR STACK BLOCK COMPRISING SEMICONDUCTOR CHIPS AND METHODS FOR PRODUCING THE SAME

(75) Inventors: Markus Brunnbauer, Lappersdorf (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 21 days.

(21) Appl. No.: 11/476,204

(22) Filed: Jun. 28, 2006

(65) Prior Publication Data
US 2007/0023883 A1 Feb. 1, 2007

(30) Foreign Application Priority Data
Jun. 28, 2005 (DE) .................. 10 2005 030 465

(51) Int. Cl.
*H01L 23/02* (2006.01)
(52) U.S. Cl. .................. 257/678; 257/777; 257/685; 257/686
(58) Field of Classification Search .................. 257/777, 257/685, 686, 782, 783, 734
See application file for complete search history.

(56) References Cited

U.S. PATENT DOCUMENTS

| | | | |
|---|---|---|---|
| 5,107,586 A | 4/1992 | Eichelberger et al. | |
| 5,279,991 A | 1/1994 | Minahan et al. | |
| 5,401,983 A | 3/1995 | Jokerst et al. | |
| 5,638,469 A | 6/1997 | Feldman et al. | |
| 5,904,502 A | 5/1999 | Ference | |
| 5,910,682 A * | 6/1999 | Song | 257/685 |
| 5,973,337 A * | 10/1999 | Knapp et al. | 257/99 |
| 6,033,931 A * | 3/2000 | Hoffman et al. | 438/109 |
| 6,124,149 A | 9/2000 | Paik et al. | |
| 6,198,164 B1 | 3/2001 | Choi | |
| 6,320,255 B1 * | 11/2001 | Terrill et al. | 257/690 |
| 6,693,348 B2 * | 2/2004 | Nakajima | 257/691 |
| 2003/0017647 A1 | 1/2003 | Kwon et al. | |

\* cited by examiner

*Primary Examiner*—Evan Pert
*Assistant Examiner*—Selim Ahmed
(74) *Attorney, Agent, or Firm*—Edell, Shapiro & Finnan, LLC

(57) ABSTRACT

A semiconductor stack block contains either stacked semiconductor chip size semiconductor devices or semiconductor devices with semiconductor chips in a plastic housing composition, the semiconductor chips and the plastic housing composition having a coplanar area. Arranged on the active top side of the semiconductor chips and the plastic housing composition is an areal wiring structure, by which device interconnects are led to an individual edge of the semiconductor devices. The edges with the ends of the device interconnects form the underside of the semiconductor stack block, external contact areas being arranged on the ends of the device interconnects, the external contact areas carrying external contacts.

16 Claims, 5 Drawing Sheets

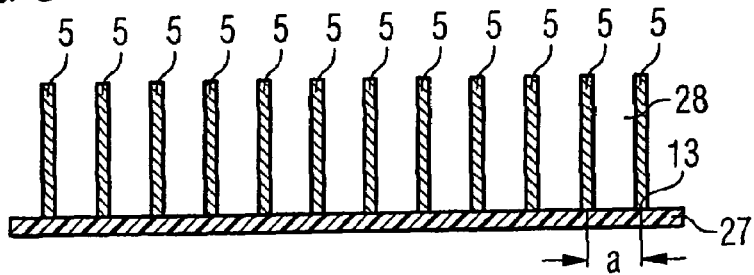
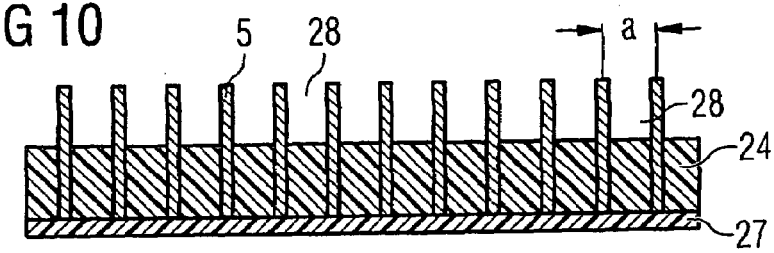
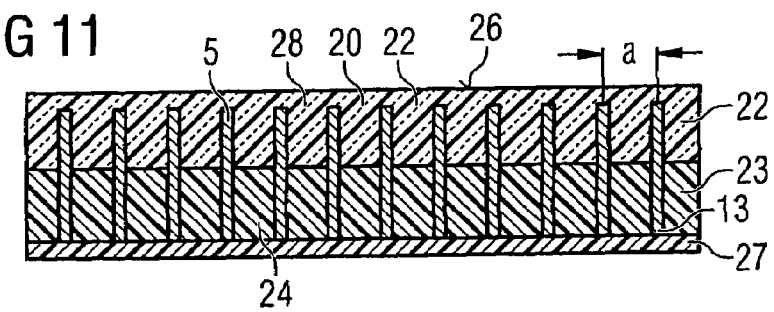
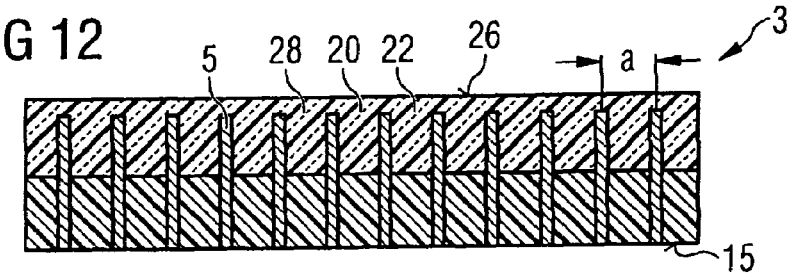
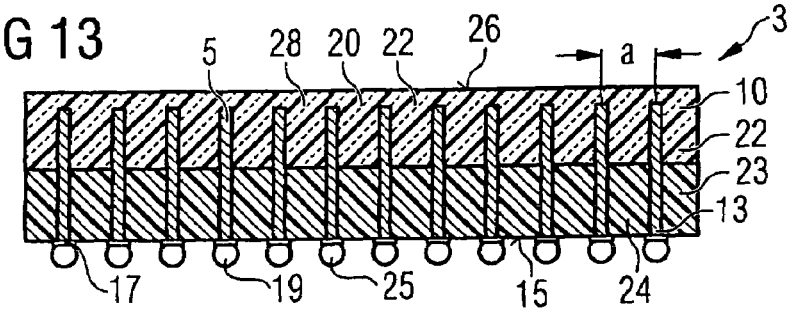

SEMICONDUCTOR STACK BLOCK COMPRISING SEMICONDUCTOR CHIPS AND METHODS FOR PRODUCING THE SAME

CROSS REFERENCE TO RELATED APPLICATIONS

This application claims priority under 35 U.S.C. §§ 119 and/or 365 to Application No. DE 102005030465.6 filed on Jun. 28, 2005, entitled "Semiconductor Stack Block Comprising Semiconductor Chips and Methods for Producing the Same," the entire contents of which are hereby incorporated by reference.

FIELD OF THE INVENTION

The invention relates to a semiconductor stack block comprising semiconductor chips. The semiconductor stack block comprises a plurality of semiconductor chip size semiconductor devices stacked one on top of another and having an areal wiring structure on the active top side of the semiconductor chips or semiconductor devices with an areal wiring structure on a coplanar area comprising a top side of a plastic composition and the active top side of the semiconductor chip.

BACKGROUND

Semiconductor chips have been assembled to form a semiconductor stack block in which connecting wires are led from the areal wiring structure on the semiconductor chips to a wiring film on an underside of the semiconductor stack block and are electrically connected to the wiring film. However, known semiconductor stack blocks have the disadvantage that the connecting wires obstruct compact stacking. For an optical semiconductor stack block with internal processing of optical signals, the connecting wires are likewise not advantageous, since an optical coupling between the chips of an optical semiconductor stack block is disturbed by the connecting wires.

Further, it has been proposed to arrange semiconductor stack blocks to permit interspaces between the stacked semiconductor chips for the purpose of cooling the semiconductor chips. Although an optical coupling is possible via the interspaces, the optical transitions between air and semiconductor chip material are not adapted to one another, with the result that transmission losses occur. Furthermore, the interspaces prevent a compact design of the semiconductor stack block. Finally, in this case too, connecting wires or connecting posts are used in part in order to electrically connect a wiring receptacle with a cutout for edge sides of the semiconductor chips to the areal wiring on the semiconductor chips. Such a construction is complex and leads to cost-intensive semiconductor step blocks.

SUMMARY

The invention provides a semiconductor stack block which is constructed compactly and overcomes the disadvantages of the semiconductor stack blocks which are known from the prior art. Furthermore, the present invention minimizes the number of wiring structures required and increases the functional reliability of such semiconductor stack blocks.

According to an exemplary embodiment, a semiconductor stack block comprises semiconductor chips, the semiconductor stack block having a plurality of semiconductor chip size semiconductor devices stacked one on top of another and having an areal wiring structure on the active top side of the semiconductor chip or semiconductor devices with an areal wiring structure on a coplanar area comprising a top side of a plastic composition and the active top side of the semiconductor chip. Each areal wiring structure of the semiconductor chips or of the semiconductor devices has device interconnects extending from contact areas of the active top side of the semiconductor chips as far as uncovered ends of the device interconnects on an individual edge of the semiconductor device.

The individual stacked edges with the uncovered ends of the device interconnects of a semiconductor stack block form a block underside. The block underside has a block wiring structure with external contact areas. In this case, the external contact areas are either arranged on the uncovered ends of the device interconnects and/or electrically connected via block interconnects to the uncovered ends of the device interconnects.

Such a semiconductor stack block has the advantage that no connecting wires whatsoever and no through contacts whatsoever are required, and it is possible to produce a plurality of chip size semiconductor devices or semiconductor devices with coplanar areas and correspondingly arranged device interconnects to form a single edge with low manufacturing costs. Furthermore, the reliability of such a semiconductor stack block is increased since no transitions from a wiring structure to connecting wires are necessary. Furthermore, the available semiconductor chip area is optimally utilized, especially as there is no need to provide any plated-through holes through semiconductor chips in order to make it possible to stack a multiplicity of semiconductor chip size semiconductor devices.

Preferably, the planes in which the device interconnects are arranged extend orthogonally with respect to the block underside. What is advantageously achieved by this construction is that the interconnect lengths in the semiconductor stack block do not go significantly beyond the lengths of the device interconnects.

Furthermore, the semiconductor stack block can be surface-mountable. This is achieved since only the underside of the semiconductor stack block has external contacts. These external contacts can be directly connected to the device interconnects via external contact areas on the underside of the semiconductor stack block by virtue of the arrangement of the external contact areas at the piercing points of the uncovered ends of the device interconnects on the underside of the semiconductor stack block.

On the other hand, via a monolayer wiring structure, it is possible for a plurality of external contact areas to be electrically interconnected and/or connected to the ends of the device interconnects via block interconnects on the underside of the semiconductor stack block, so that the number of external contacts is reduced and device interconnects can be supplied with identical signals or supply potentials via an external contact on the underside of the semiconductor stack block. Both the areal wiring structures on the semiconductor devices and the monolayer wiring structure with external contact areas and/or block interconnects are preferably patterned photolithographically by firstly applying a large-area metal layer, which is subsequently etched photolithographically to form a wiring structure, by way of example. For this purpose, the wiring structures have etchable metals.

In one preferred embodiment of the invention, the plastic composition over the top side of which the device interconnects are led may have an optically transparent plastic. Such optically transparent plastics have the advantage that their coefficient of thermal expansion can be optimally adapted to the coefficient of thermal expansion of the semiconductor chips.

The stacked semiconductor devices associated with a semiconductor stack block may be connected to one another by a cohesive adhesive layer. Such an adhesive layer in turn preferably has a transparent plastic if, on the one hand, the intention is to enable an optical coupling between the semiconductor devices and, on the other hand, an optimum adaptation of the coefficient of thermal expansion of the plastic adhesive to the coefficient of thermal expansion of the semiconductor chips is sought.

Instead of an adhesive layer or a double-sided adhesive film, the stacked semiconductor devices may also be connected to one another by a plastic housing composition. For this purpose, the interspaces between the stacked semiconductor devices are filled with a plastic housing composition, which preferably has an optically transparent plastic. In this case it is possible to accommodate between the semiconductor devices in the semiconductor device stack optical elements, such as concave or convex lenses, and also coupling elements for the optical conduction of signals.

In one preferred embodiment of the invention, the semiconductor stack block comprises a lower and an upper plastic housing composition between the stacked semiconductor devices, the lower plastic housing composition preferably having a nontransparent plastic and the upper plastic housing composition having a transparent plastic. Such a semiconductor stack block has the advantage that the top side of the semiconductor stack block can emit, in an unimpeded manner, optical signals generated by corresponding semiconductor chips of the semiconductor stack block. On the other hand, the nontransparent lower plastic housing composition ensures that electrical excitation signals can be coupled into the optical transmitters from the underside of the semiconductor stack block via surface-mountable external contacts from a corresponding superordinate circuit board.

In a further preferred embodiment of the invention, the upper plastic housing composition comprises heat conducting, preferably thermally conductive particles or thermally conductive metal sheets or metal fibers that are embedded in the upper plastic housing composition. This embodiment of the invention has the advantage that in the case of a bipartite plastic housing composition comprising lower and upper plastic housing composition, the upper region of the semiconductor stack block can be cooled more intensively or its heat loss can be dissipated better. This dissipation of the heat loss may also be reinforced by a heat sink being arranged on the top side of the semiconductor stack block.

As already mentioned above, the semiconductor block stack according to the invention is particularly suitable for use as a data processing optical semiconductor module, the distance between the semiconductor devices being filled with a transparent plastic housing composition.

A first method for producing a semiconductor stack block comprising semiconductor chips includes the following operations. A semiconductor wafer with semiconductor chip positions arranged in rows and columns is produced. Areal wiring structures are applied on the semiconductor chip positions, the wiring structures having device interconnects extending from contact areas of the active top side of the semiconductor chip positions as far as a separating track of an individual edge of the respective semiconductor chip positions. A semiconductor wafer is then separated along the separating tracks to form semiconductor chip size semiconductor devices with the areal wiring structure on the active top side of the semiconductor chip. A plurality of semiconductor chip size semiconductor devices are then stacked to form a semiconductor stack block with alignment of the individual edge sides with ends of the device interconnects to form a block underside of the semiconductor stack block. A block wiring structure with external contact areas is applied to the underside. The external contact areas are then equipped with external contacts on the block underside. A semiconductor stack block that is surface-mountable by its block underside is thus available.

This method has the advantage that there is no need to provide any through contacts whatsoever on the semiconductor wafer in the region of the separating tracks for the individual semiconductor chip positions, as is conventionally required. Such complicated method steps are obviated because, according to the invention the individual edges have ends of the device interconnects, and these edges with the ends of the device interconnects form the block underside during the stacking of the semiconductor stack block. This means that, in an advantageous manner, for the application of a block wiring structure with external contact areas, all connection possibilities are available for the individual semiconductor chip size semiconductor devices, which can subsequently be equipped with external contacts without any problems.

A second method for producing a semiconductor stack block comprising semiconductor chips differs from the first method as early as the point of the second operation and includes the following operation. As in the first method, a semiconductor wafer with semiconductor chip positions arranged in rows and columns is produced. This semiconductor wafer is subsequently separated along separating tracks to form semiconductor chips with contact areas on their active top sides. This is followed by producing from the semiconductor chips with contact areas on their active top sides a composite plate made from a plastic composition with a planar top side and semiconductor chips embedded in the plastic composition.

The semiconductor chips are embedded in the plastic composition such that the active top sides of the semiconductor chips together with the top side of the plastic composition form coplanar areas. For this purpose, the semiconductor chips are in turn embedded in the plastic composition in rows and columns to form semiconductor device positions. An areal wiring structure is then applied to the coplanar area, the wiring structure having device interconnects extending from the contact areas of the active top side of a semiconductor chip in a semiconductor device position as far as a separating track of an individual edge of the semiconductor device position. The composite plate is subsequently separated along the separating tracks to form semiconductor devices.

Finally, a plurality of such semiconductor devices are stacked to form a semiconductor stack block with alignment of the individual edge sides with ends of the device interconnects to form a block underside of the semiconductor stack block. Finally, a block wiring structure with external contact areas is applied to the resulting block underside. The external contact areas are finally equipped with external contacts on the block underside, so that a semiconductor stack block with surface-mountable external contacts on its block underside is available.

This method has the advantage that the available area for fitting device interconnects that lead to one of the edge sides of the devices is greater than with semiconductor chip size semiconductor devices, as is the case for the first method. Moreover, this method makes it possible to use a series of different techniques in order, on the one hand, to level the block underside and, on the other hand, to uncover the interconnect ends to an extent such that they are available for embedding in a block wiring structure. One of the preferred techniques for uncovering the interconnect ends is to remove the plastic composition on the block underside by means of laser removal, the laser removal energy being set such that the ends of the device interconnects are preserved.

For a compact semiconductor stack block, the semiconductor devices are adhesively bonded one on top of another with alignment of the edge sides with the ends of the device interconnects to form a block underside. For an optical semiconductor stack block, both for the embedding of the semiconductor chips in the method for producing the semiconductor devices of the semiconductor stack block and the adhesive may comprise a transparent plastic component. This enables an intensive coupling between optical components of the individual semiconductor devices in an optical semiconductor stack block.

For a semiconductor stack block with a larger emission area, preferably toward the top side of the semiconductor stack block, larger interspaces are provided between the semiconductor devices. For stacking such a semiconductor stack block, the semiconductor devices are adhesively bonded onto a film in spaced-apart fashion by the edge sides having the ends of the device interconnects and their perpendicular alignment with regard to the film is secured by a removable holder. The distance between the semiconductor devices is subsequently filled with a plastic housing composition to form a semiconductor stack block.

After filling, the film may be removed from the block underside. If necessary, after the removal of the film, the edge sides with the ends of the device interconnects may be leveled to form an areal block underside and access to the ends of the device interconnects may simultaneously be uncovered.

In one preferred exemplary implementation of the method, the distance between the semiconductor devices is filled with a plastic composition in two steps. First, a lower region is filled with a lower plastic composition and thereafter the remainder of the distances is filled with an upper plastic composition. This two-stage process has the advantage that a different plastic may possibly be employed for the upper region and, moreover, there is the possibility of introducing additional elements, such as lenses in the case of optical semiconductor devices or heat sinks in the case of power semiconductor devices, into the interspaces of the upper region. In one exemplary implementation of the method for optical semiconductor stack blocks, the interspaces are filled with a plastic composition comprising an optically transparent plastic. In the bipartition in the course of filling with plastic composition, a nontransparent plastic may be used as lower plastic composition and a transparent plastic may be used as upper plastic composition.

Both the areal wiring structure on the semiconductor devices of the semiconductor device positions and the application of the block wiring structure to the block underside of the semiconductor stack block may be effected photolithographically such that a closed metal layer is first deposited on the surfaces, which is subsequently patterned photolithographically to form an areal wiring structure. In the case of the block wiring structure, the block underside may be patterned photolithographically such that the external contact areas are either arranged on the free ends on the device interconnects and/or connected via block interconnects to the free ends of the device interconnects.

To summarize, it can be established that the invention solves the problem of space-intensive wiring and the problem of the lack of transparent paths out of a plastic housing package by contact being made with only a top side of the stacked semiconductor devices by means of photolithographic processes and the use of encapsulants filled with transparent inorganic fillers, if appropriate, for the entire semiconductor stack block. The invention thus creates a new three-dimensional packaging principle which makes it possible, through novel contact-making, to stack a large number of semiconductor devices, in particular optical semiconductor devices in a space-saving manner.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in more detail with reference to the accompanying figures.

FIG. 2 shows a perspective view of a semiconductor device for the semiconductor stack block in accordance with FIG. 1.

FIG. 3 shows a schematic, perspective view of a plurality of semiconductor devices in accordance with FIG. 2 after being adhesively bonded together to form a semiconductor stack block.

FIG. 4 shows a schematic, perspective view of a completed semiconductor stack block in accordance with FIG. 1.

FIG. 5 shows a schematic cross section through a plurality of semiconductor devices which are aligned and fixed on a film;

FIG. 6 shows a schematic cross section through the semiconductor devices in accordance with FIG. 5 after the interspaces have been filled with an optically transparent plastic to form a semiconductor stack block;

FIG. 7 shows a schematic cross section through the semiconductor stack block in accordance with FIG. 6 after the removal of the film; and FIG. 8 shows a schematic cross section through the semiconductor stack block in accordance with FIG. 7 after the leveling of the block underside and the application of external contacts to the block underside.

FIGS. 9 to 13 show schematic cross sections through components of a semiconductor stack block during the production of a third embodiment of the invention, in particular:

FIG. 9 shows a schematic cross section through a plurality of semiconductor devices which are aligned and fixed on a film;

FIG. 10 shows a schematic cross section through the semiconductor devices of FIG. 9 after the partial filling of the interspaces in a lower region with a nontransparent plastic;

FIG. 11 shows a schematic cross section through the semiconductor devices in accordance with FIG. 10 after the complete filling of the interfaces between the semiconductor devices with an optically transparent plastic to form a semiconductor stack block of the third embodiment of the invention;

FIG. 12 shows a schematic cross section through the semiconductor stack block in accordance with FIG. 11 after the removal of the film; and FIG. 13 shows a schematic cross section through the semiconductor stack block in accordance with FIG. 12 after the leveling of the block underside and the application of external contacts to the block underside.

DETAILED DESCRIPTION

Figure 1:
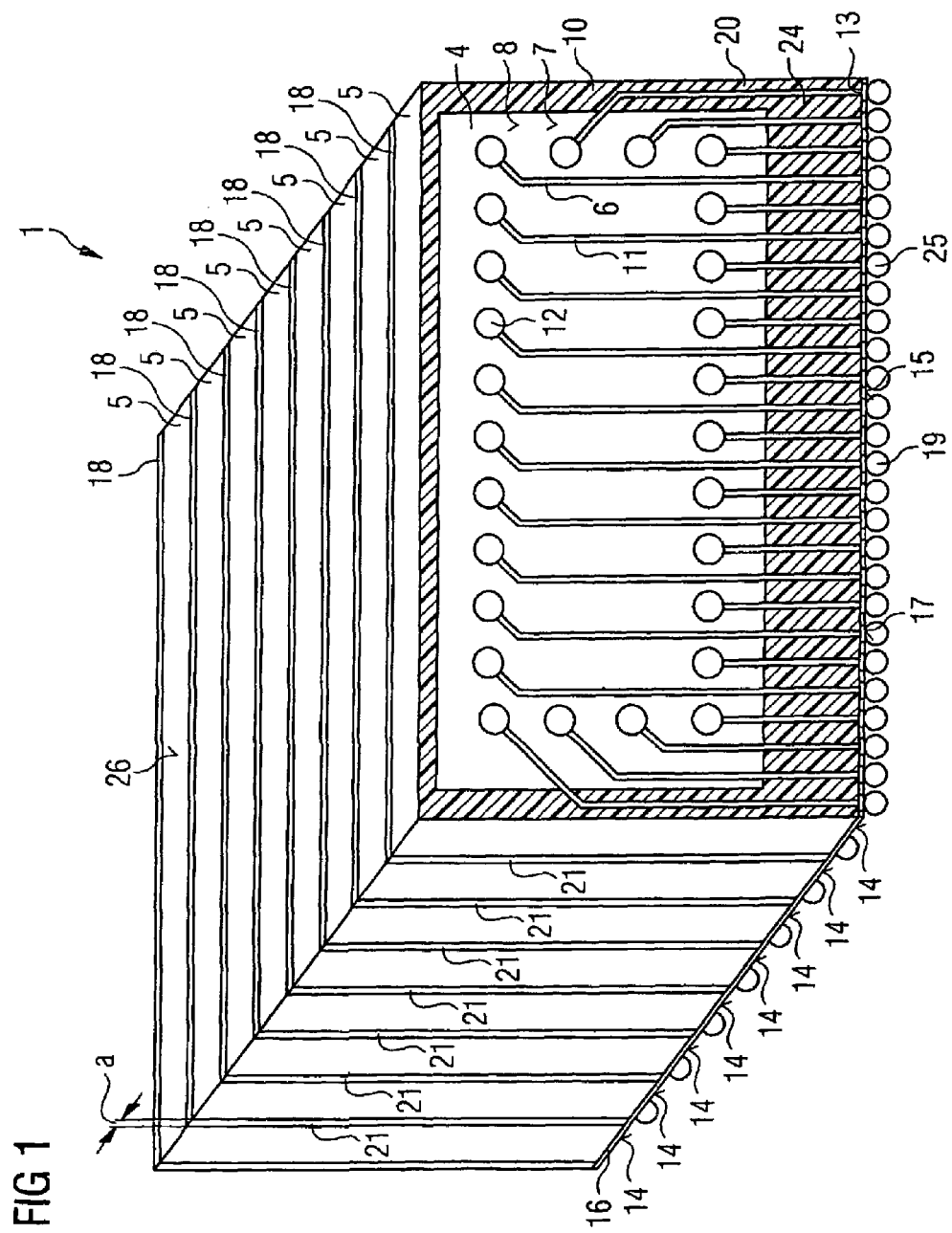
FIG. 1 shows a schematic, perspective, cut-away view of a semiconductor stack block in accordance with a first embodiment of the invention.

FIG. 1 shows a schematic, perspective, cut-away view of a semiconductor stack block 1 in accordance with a first embodiment of the invention. The semiconductor stack block 1 comprises semiconductor devices 5 which are stacked onto one another and are connected to one another by an adhesive layer 21. The individual semiconductor chips 4 of each of the semiconductor devices 5 are embedded in a plastic composition 10 by their edge sides and their rear side, the top side 9 of the plastic composition and the active top sides 7 of the semiconductor chips 4 forming a coplanar area 8, on which an areal wiring structure 6 is arranged. The areal wiring structure 6 has contact areas 12 leading via device interconnects 11 extending from the active top sides 7 of the semiconductor chips 4 via the top side 9 of the plastic composition 10 to an individual edge 14 of the semiconductor device 5.

The uncovered ends 13 of the device interconnects 11 merge into a block wiring structure 16, arranged on the block underside 15, into external contact areas 17. Since, when the semiconductor devices 5 are adhesively bonded one on top of another, the semiconductor devices are aligned such that the uncovered ends 13 of the device interconnects 11 are aligned orthogonally with respect to the block underside 15, it is possible to reach all the contact areas 12 on the individual semiconductor devices 5 from the block underside 15. For this purpose, the planes 18 in which the device interconnects 11 are arranged are aligned orthogonally with respect to the block underside 15. The external contacts 25 are embodied as solder balls 19 on the external contact areas 17 of the block wiring structure 16 on the block underside 15 of the semiconductor stack block 1. The block underside 15 with its surface-mountable solder balls 19 yields all the prerequisites for a reliable surface mounting of the semiconductor stack block 1 on a superordinate circuit board.

The adhesive layer 21 may also be replaced by a double-sided adhesive film. Moreover, after the alignment of the semiconductor devices 5, the block underside 15 may be leveled by laser removal such that the ends 13 of the device interconnects 11 project from the block underside 15 such that external contact areas 17 can be fitted in a reliable manner.

For a semiconductor stack block 1 with optoelectronic signal processing, the plastic composition 10 may also be embodied as an optically transparent plastic composition 20 to enable the optical signal coupling between individual optoelectronic semiconductor devices 5.

Figure 2:
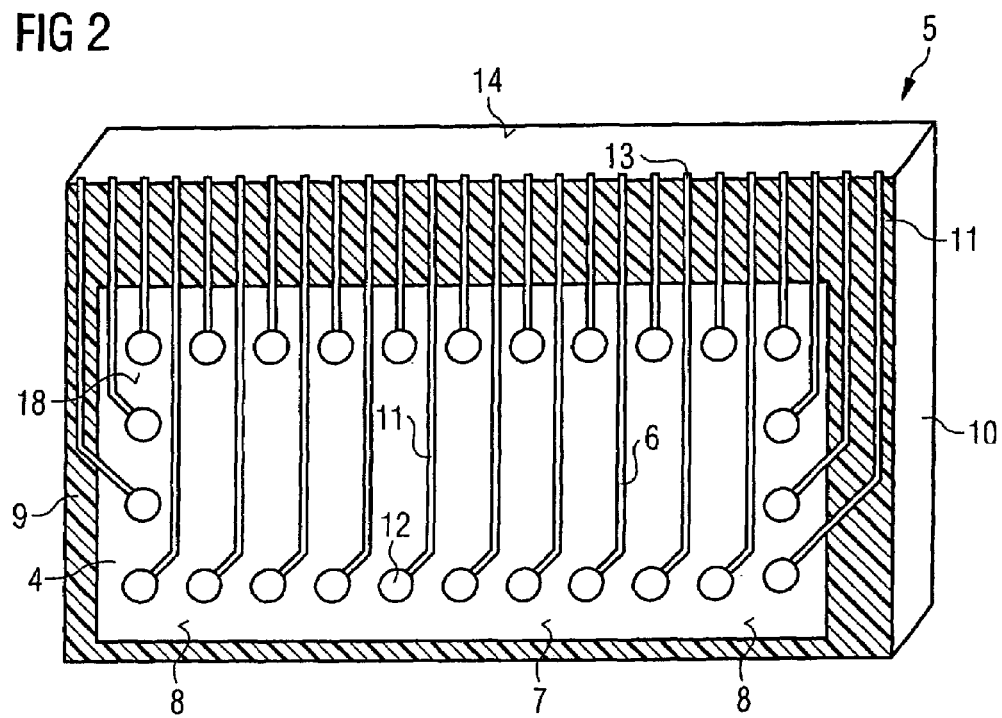
FIGS. 2 to 4 shows schematic, perspective views of components during the production of a semiconductor stack block in accordance with FIG. 1.
Figure 3:
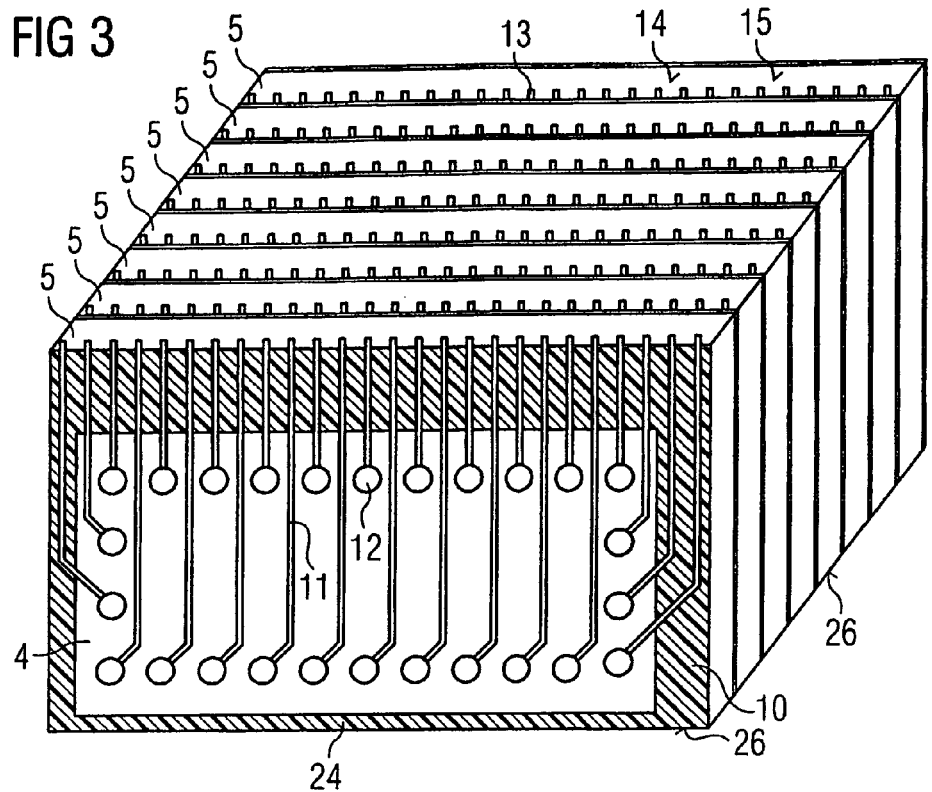
Figure 4:
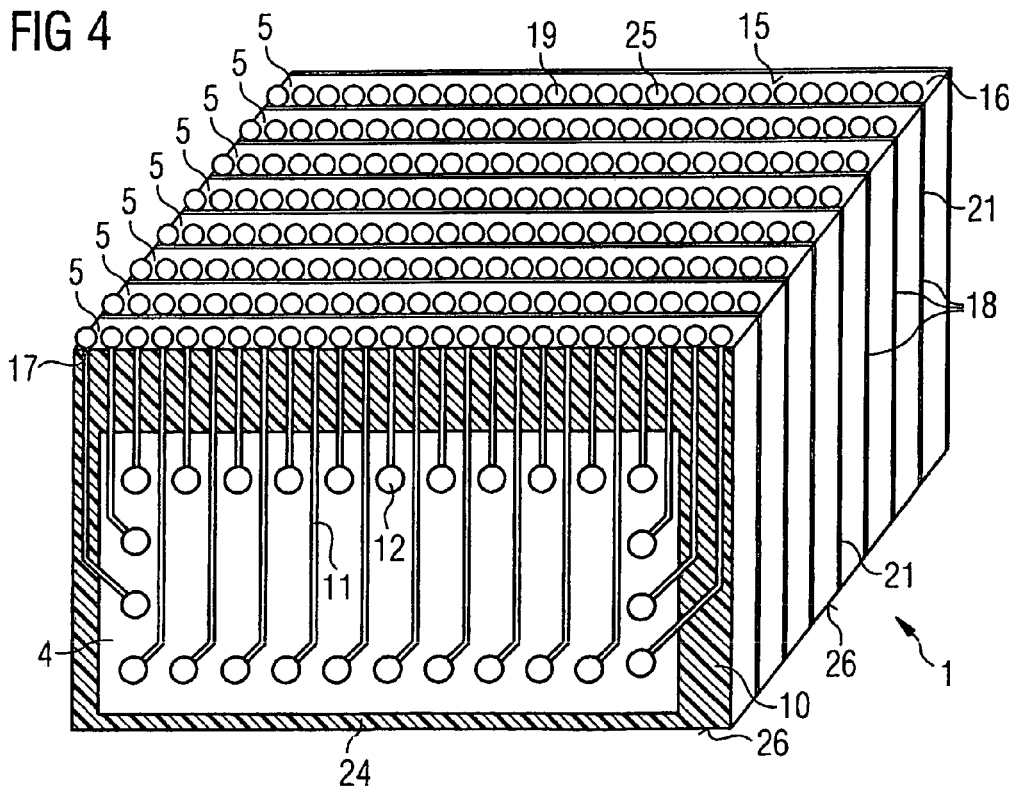

FIGS. 2 to 4 show schematic, perspective views of components during the production of semiconductor stack block 1 in accordance with FIG. 1. Components having functions identical to those in FIG. 1 are identified by the same reference symbols in FIGS. 2 to 4 and are not explained separately.

FIG. 2 shows a schematic, perspective view of an individual semiconductor device 5 for the semiconductor stack block 1 in accordance with FIG. 1. In order to produce such a semiconductor device 5, the semiconductor chips 4 embedded in a plastic housing composition 10 are enveloped by molding and provided, in a photolithographic multi-process, with a fan-out of all the contact areas 12 toward one side, so that they can be contact-connected from the adjoining edge side 14. Such a semiconductor device 5 is produced in a so-called "universal package method." The device interconnects 11 are taken toward the edge 14 (fan out) to such an extent that their ends 13 can be contact-connected from the edge side 14 after the singulation of the semiconductor devices 5 from a composite plate made from plastic 10 and semiconductor chips 4 arranged in rows and columns.

For the semiconductor stack block, it is also possible to use differently sized semiconductor chips 4, these different semiconductor chips 4 being enveloped by molding in a common process, so that their areal wiring structures 6 appear to have the same size after singulation. The individual semiconductor devices 5 are subsequently connected, in the manner shown in FIG. 3, by an adhesive or a double-sided adhesive film to form a parallelepiped for a semiconductor stack block.

FIG. 3 shows a schematic, perspective view of a plurality of semiconductor devices 5 in accordance with FIG. 2 after being joined together cohesively to form a semiconductor stack block 1. In this case, the individual semiconductor devices 5 are aligned such that their individual edges 14 with the ends 13 of the device interconnects form a common parallelepiped side as block underside 15. The block underside 15 may be planarized and provided, in a second photolithographic multi-process, with a further wiring structure, the block wiring structure 16, which is then available for fitting external contacts in the form of solder balls.

FIG. 4 shows a schematic, perspective view of a completed semiconductor stack block 1 in accordance with FIG. 1. For this purpose, onto the parallelepiped shown in FIG. 3 a block wiring structure 16 is applied to a block underside 15 such that one of the ends 13 of the device interconnects 11 is provided with an external contact area 17. This results in a multiplicity of surface-mountable solder balls 19 arranged on the block underside 15 as external contacts 25. However, it is also possible to configure the block wiring structure 16 such that the number of external contacts 25 is reduced via external contacts 25 for supply lines being connected to one another via corresponding block interconnects of the block wiring structure 16.

FIGS. 5 to 8 show schematic cross sections through components during the production of a semiconductor stack block 2 of a second embodiment of the invention. Components having functions identical to those in the previous figures are identified by the same reference symbols in FIGS. 5 to 8 and are not explained separately.

Figure 5:
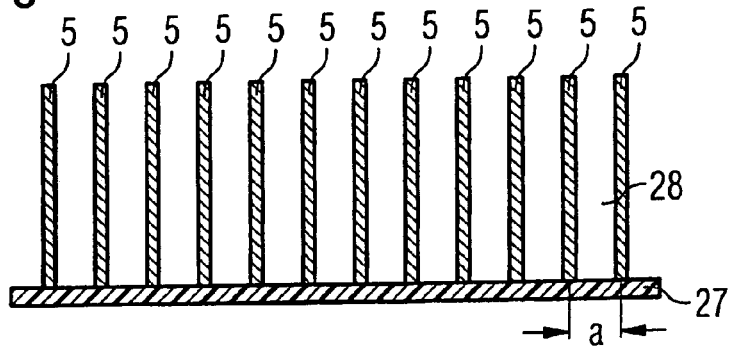
FIGS. 5 to 8 show schematic cross sections through components during the production of a semiconductor stack block of a second embodiment of the invention, in particular.

FIG. 5 shows a schematic cross section through a plurality of the semiconductor devices 5 which are aligned and fixed on a film 27 in a mold, so that an interspace 28 arises between the semiconductor devices 5. The vertical alignment of the semiconductor devices 5 can be temporarily supported by a mount (not shown here).

Figure 6:
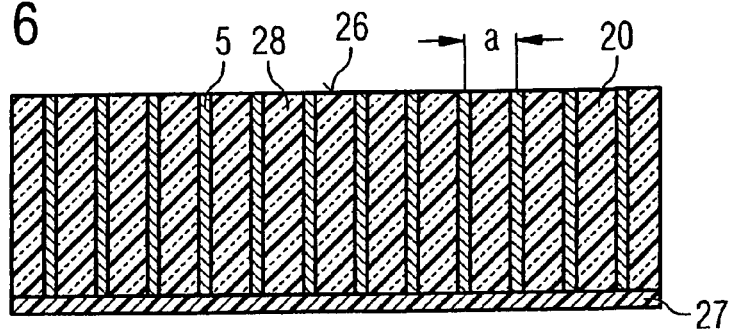

FIG. 6 shows a schematic cross section through the semiconductor devices 5 in accordance with FIG. 5 after the filling of the interspaces 28 with an optically transparent plastic 20 to form an optoelectronic semiconductor stack block 2. This process of filling the interspaces 28 may be performed via dispensing an optically transparent plastic into the interspaces 28. It is also conceivable to effect molding in the course of which the transparent plastic 20 is pressed into the interspaces 28 with the aid of a mold.

Figure 7:
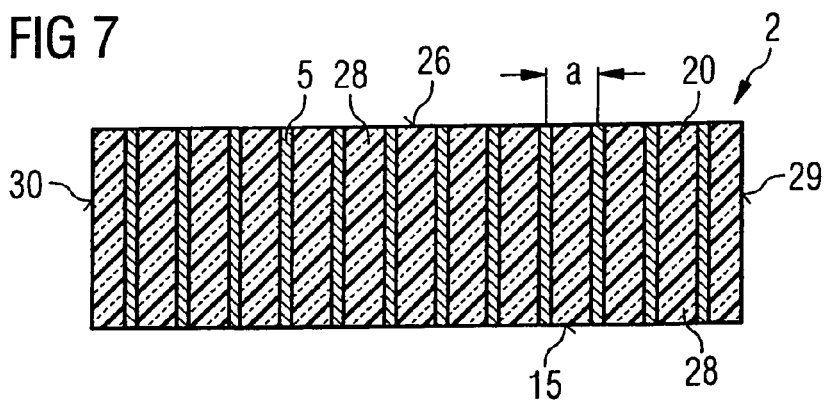

FIG. 7 shows a schematic cross section through the semiconductor stack block 2 in accordance with FIG. 6 after a removal of the film 27. The removal of the film 27 after the interspaces 28 have been filled with an optically transparent layer 20 is relatively unproblematic, so that the finished semiconductor stack block 2 is present after this removal of the film 27. Prior to the application of the transparent plastic composition 20, however, corresponding optical coupling layers or lenses may be applied on the active top sides of the semiconductor chips of the individual semiconductor devices 5 that operate optoelectronically. Through the transparent structure of the semiconductor stack block 2, optical signals can be emitted via the plastic composition 20 in the interspaces 28 to all the edge sides of the parallelepiped apart from the end sides 29 and 30.

Figure 8:
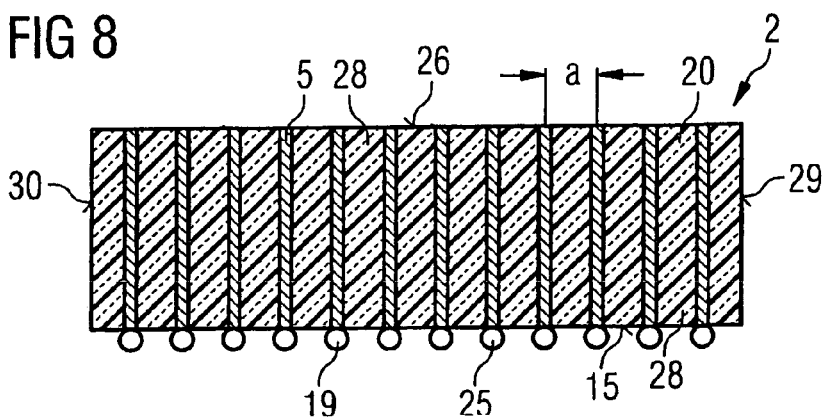

FIG. 8 shows a schematic cross section through the semiconductor stack block 2 in accordance with FIG. 7 after the leveling of the block underside 15 and the application of external contacts 25 to the block underside 15. In this schematic illustration, each end of the semiconductor device lines is provided with an external contact 25 in the form of a solder ball 19. However, this is not absolutely necessary, rather a wiring structure (not shown here) which connects a plurality of the ends of the device interconnects to one another may also be fitted on the block underside 15.

FIGS. 9 to 13 show schematic cross sections through components of a semiconductor stack block 3 during the production of a third embodiment of the invention. Components having functions identical to those in the previous figures are identified by the same reference symbols in FIGS. 9 to 13 and are not explained separately.

FIG. 9 shows a schematic cross section through a plurality of semiconductor devices 5 which are aligned and fixed on a film 27. In this case, interspaces 28 arise between the semiconductor devices 5, which are at a distance a. The vertical alignment of the semiconductor devices 5 may once again be ensured by a removable holder. In this embodiment of the invention, the interspaces 28 first are incompletely filled with a plastic.

FIG. 10 shows a schematic cross section through the semiconductor devices 5 from FIG. 9 after the interspaces 28 have been partially filled with a nontransparent plastic 24. The nontransparent plastic 24 holds the semiconductor devices 5 in an aligned position on the film 27. Furthermore, the nontransparent plastic, with its plastic housing composition 23 arranged in the lower region of the planned semiconductor stack block, provides for an orthogonal alignment of the semiconductor devices 5 in relation to the plane of the plastic film 27.

FIG. 11 shows a schematic cross section through the semiconductor devices 5 in accordance with FIG. 10 after the complete filling of the interspaces 28 between the semiconductor devices 5 with an optically transparent plastic housing composition 22 to form a semiconductor stack block 3 of the third embodiment of the invention. Instead of the transparent plastic 20, the upper part may also be filled with a heat conducting plastic housing composition which ensures that an improved heat transfer to the top side 26 of the semiconductor stack block 3 arises.

FIG. 12 shows a schematic cross section through the semiconductor stack block 3 in accordance with FIG. 11 after the removal of the film 27. The semiconductor stack block 3 is thus practically finished. It is merely necessary for the underside 25 to be leveled to an extent such that the ends 13 of the device interconnects (not shown) are freely accessible for fitting external contact areas 17. If the upper plastic housing composition 22 is a transparent plastic 20, then it is ensured that optical signals can be emitted from the top side 26. If, by contrast, the plastic housing composition 22 in the upper region of the semiconductor stack block 3 is provided with particles, sheets or fibers that improve heat conduction, then the semiconductor stack block 3 is suitable for receiving an additional heat sink on its top side 26, which additional heat sink makes it possible to dissipate the power loss of the semiconductor devices 5 in the semiconductor stack block 3.

FIG. 13 shows a schematic cross section through the semiconductor stack block 3 in accordance with FIG. 12 after the leveling of the block underside 15 and the application of external contacts 25 to the block underside 15. In this embodiment, too, as a precaution a block wiring structure having at least external contact areas 17 for the external contacts 25 is applied to the ends 13 of the device interconnects.

Having described preferred embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SYMBOLS

| | |
|---|---|
| 1 | semiconductor stack block (1st embodiment) |
| 2 | semiconductor stack block (2nd embodiment) |
| 3 | semiconductor stack block (3rd embodiment) |
| 4 | semiconductor chip |
| 5 | semiconductor device |
| 6 | areal wiring structure |
| 7 | active top side of the semiconductor chip |
| 8 | coplanar area |
| 9 | top side of the plastic composition |
| 10 | plastic composition |
| 11 | device interconnect |
| 12 | contact area |
| 13 | uncovered end |
| 14 | edge |
| 15 | block underside |
| 16 | block wiring structure |
| 17 | external contact area |
| 18 | plane of the device interconnects |
| 19 | solder ball |
| 20 | optically transparent plastic composition |
| 21 | adhesive layer |
| 22 | plastic housing composition (upper, transparent) |
| 23 | plastic housing composition (lower, nontransparent) |
| 24 | nontransparent plastic |
| 25 | external contact |
| 26 | top side of the semiconductor stack block |
| 27 | film |
| 28 | interspace |
| 29 | end side |
| 30 | end side |
| a | distance between semiconductor devices |

What is claimed is:

1. A semiconductor stack block comprising:
a plurality of semiconductor chip size semiconductor devices stacked one on top of another, individual ones of the semiconductor devices comprising: a semiconductor chip with an active top side including contact areas; a plastic composition with a top side that forms a coplanar area with the active top side; and an areal wiring structure on the coplanar area, the areal wiring structure comprising device interconnects extending from the contact areas of the active top side of the semiconductor chip to an edge of the semiconductor device, the device interconnects having uncovered ends at the edge of the semiconductor device, wherein the edges of the semiconductor devices in the semiconductor stack block collectively form a block underside at which the uncovered ends of the device interconnects are disposed; and a block wiring structure with external contact areas arranged on the uncovered ends of the device interconnects and/or electrically connected via block interconnects to the uncovered ends of the device interconnects.

2. The semiconductor stack block as claimed in claim 1, wherein planes in which the device interconnects are arranged extend orthogonally with respect to the block underside.

3. The semiconductor stack block as claimed in claim 2, wherein the semiconductor stack block is surface-mountable.

4. The semiconductor stack block as claimed in claim 1, wherein the external contact areas comprise external contacts.

5. The semiconductor stack block as claimed in claim 1, wherein the external contact areas comprise solder balls.

6. The semiconductor stack block as claimed in claim 1, wherein the areal wiring structures are patterned photolithographically.

7. The semiconductor stack block as claimed in claim 1, wherein the areal wiring structure comprises an etchable metal that forms a patterned metal layer.

8. The semiconductor stack block as claimed in claim 1, wherein the plastic composition comprises an optically transparent plastic.

9. The semiconductor stack block as claimed in claim 1, wherein a coefficient of thermal expansion of the plastic composition is adapted to the coefficient of thermal expansion of the semiconductor chips.

10. The semiconductor stack block as claimed in claim 1, wherein the semiconductor stack block comprises an adhesive layer between the stacked semiconductor devices, the adhesive layer comprising a transparent plastic.

11. The semiconductor stack block of claim 1, wherein the plastic composition is arranged adjacent at least one side face of the semiconductor chip.

12. The semiconductor stack block of claim 1, wherein the device interconnects extend from the contact areas of the active top side of the semiconductor chip via the top side of the plastic composition to the individual edge of the semiconductor device.

13. The semiconductor stack block as claimed in claim 1, wherein the semiconductor stack block comprises a plastic housing composition between the stacked semiconductor devices, the plastic housing composition comprising a transparent plastic.

14. The semiconductor stack block as claimed in claim 1, wherein the semiconductor stack block comprises a lower and an upper plastic housing composition between the stacked semiconductor devices, the lower plastic housing composition comprising a nontransparent plastic and the upper plastic housing composition comprising a transparent plastic.

15. The semiconductor stack block as claimed in claim 14, further comprising heat conducting elements embedded in the upper plastic housing composition, the heat conducting elements comprising at least one of: thermally conductive particles, thermally conductive metal sheets, and metal fibers.

16. The semiconductor stack block as claimed in claim 13, further comprising a heat sink arranged on a top side of the semiconductor stack block.

* * * * *